United States Patent

Watanabe et al.

[11] Patent Number: 6,119,334
[45] Date of Patent: Sep. 19, 2000

[54] METHOD AND APPARATUS FOR CONNECTING WIRING BOARDS AND INK JET RECORDING HEAD AND RECORDING APPARATUS

[75] Inventors: Yasutomo Watanabe, Hiratsuka; Riichi Saito, Fujisawa, both of Japan

[73] Assignee: Canon Kabushiki Kaisha, Tokyo, Japan

[21] Appl. No.: 09/025,748

[22] Filed: Feb. 18, 1998

[30] Foreign Application Priority Data

Feb. 19, 1997 [JP] Japan .................................. 9-034837

[51] Int. Cl.⁷ ...................................................... H05K 3/36
[52] U.S. Cl. ................................ 29/830; 29/825; 29/829; 29/846
[58] Field of Search .............................. 29/830, 827, 825, 29/846, 831, 840

[56] References Cited

U.S. PATENT DOCUMENTS

| | | | |
|---|---|---|---|
| 5,227,812 | 7/1993 | Watanabe et al. | 346/140 R |
| 5,576,748 | 11/1996 | Tamura | 347/58 |
| 5,696,543 | 12/1997 | Koizumi et al. | 347/17 |

FOREIGN PATENT DOCUMENTS

| | | |
|---|---|---|
| 0 564 080 | 10/1993 | European Pat. Off. . |
| 0 715 201 | 6/1996 | European Pat. Off. . |
| 1-194322 | 8/1989 | Japan . |
| 2-033997 | 2/1990 | Japan . |
| 3-165600 | 7/1991 | Japan . |
| 5-13918 | 1/1993 | Japan . |
| 5-323347 | 12/1993 | Japan . |
| 5-343149 | 12/1993 | Japan . |
| 7-114037 | 5/1995 | Japan . |

Primary Examiner—Carl J. Arbes
Attorney, Agent, or Firm—Fitzpatrick, Cella, Harper & Scinto

[57] ABSTRACT

A wiring board connecting method of electrically connecting a plurality of first wiring boards juxtaposed side by side each having terminals at one end, to a second common wiring board having a plurality of terminal groups to be connected to the terminals of the first wiring boards. The method includes the steps of providing a first position alignment mark at each side area of each of the first wiring boards and a second position alignment mark at each area between adjacent terminal groups of the second wiring board, after the first and second wiring boards are superposed to make the areas provided with the first and second position alignment marks face one another, aligning the first wiring boards with the second wiring board so as to make the largest gap between the first and second position alignment marks as small as possible, and electrically connecting the first wiring boards to the second wiring board.

11 Claims, 12 Drawing Sheets

METHOD AND APPARATUS FOR CONNECTING WIRING BOARDS AND INK JET RECORDING HEAD AND RECORDING APPARATUS

BACKGROUND OF THE INVENTION

1. Field of the Invention

The present invention relates to a method and apparatus for electrically connecting a plurality of flexible film wiring boards juxtaposed together to a common wiring board. The present invention also relates to an ink jet recording head having a wiring structure realized by the connecting method and apparatus and to an ink jet recording apparatus using such an ink jet recording head.

2. Related Background Art

Ink jet recording apparatuses are recording apparatuses of a so-called non-impact type. A recording apparatus of this type is characterized in that it can record at high speed, can use a variety type of recording media, and hardly generates noises during recording. From this reason, it has been widely used by apparatuses having a recording mechanism such as printers, word processors, facsimiles and photocopiers.

For ink jet recording, a fine droplet is jetted out from a minute jet port onto a recording sheet. As a typical one, a method using electrothermal conversion elements is known. For such ink jet recording, generally an ink jet recording head and an ink supply system are used, the former having nozzles for forming droplets and the latter supplying ink to the head. In an ink jet recording head using electrothermal conversion elements, each electrothermal conversion element mounted on a nozzle is supplied with an electric pulse as a recording signal to conduct thermal energy to recording liquid. A bubble pressure caused by phase transition of the recording liquid to a bubbling (boiling) state is utilized to jet out a recording droplet.

The type of an ink jet recording head using electrothermal conversion heads includes a type (called an "edge shooter type") which jets out recording liquid in parallel to a substrate on which electrothermal conversion elements are mounted and another type (called a "side shooter type") which jets out recording liquid perpendicular to a substrate on which electrothermal conversion elements are mounted.

In order to supply such an ink jet recording head with an electric pulse as a recording signal, wiring boards have been used. Terminals on a plurality of wiring boards are electrically interconnected in some cases from the reason of manufacture or the like. In such cases, if terminals are not interconnected reliably between wiring boards, electrical conduction defects may occur. However, if the total manufacture efficiency of ink jet recording apparatuses becomes low or the size thereof becomes large in order to ensure the reliability of electrical conduction, this is meaningless in terms of practical use.

Such a technical issue becomes more strict as the number of jet ports of an ink jet recording head increases and the number of signal lines via which an electric pulse is applied to the head increases.

SUMMARY OF THE INVENTION

It is an object of the present invention to provide a method and apparatus for interconnecting wiring boards, capable of connecting a plurality of juxtaposed flexible film wiring boards collectively to a common wiring board without any connection failure such as disconnection and short circuit, even if there is a displacement of each flexible film wiring board.

It is another object of the present invention to provide an ink jet recording head with the connection structure realized through the above method and apparatus and an ink jet recording apparatus with such a recording head, capable of preventing a print quality from being lowered, otherwise to be caused by connection defects between flexible film wiring boards and a common wiring board.

It is a still further object of the present invention to provide a wiring board connecting method of electrically connecting a plurality of first wiring boards juxtaposed side by side each having terminals at one end, to a second common wiring board having a plurality of terminal groups to be connected to the terminals of the first wiring boards, comprising the steps of: providing a first position alignment mark at each side area of each of the first wiring boards and a second position alignment mark at each area between adjacent terminal groups of the second wiring board; after the first and second wiring boards are superposed to make the areas provided with the first and second position alignment marks face one another, aligning the first wiring boards with the second wiring board so as to make the largest gap between the first and second position alignment marks as small as possible; and electrically connecting the first wiring boards to the second wiring board.

According to the wiring board connecting method of the invention, position alignment marks are provided at each of the flexible film wiring boards and common wiring board. The flexible film wiring boards and common wiring board are aligned in position so as to make a largest gap between the position alignment marks of the flexible film wiring boards and common wiring board as small as possible. Accordingly, even if there is a displacement of each flexible film wiring board from a normal position, good connection can be established between the flexible film wiring boards and common wiring board. If an anisotropic conductive adhesive member is used, the flexible film wiring boards and common wiring board can be connected without using solder. It is therefore possible to eliminate various defects to be otherwise caused by flux of solder.

According to the wiring board connecting apparatus of this invention, the image processing mechanism optically detects the connection area between the flexible film wiring boards and common wiring board, particularly, the position alignment marks, and in accordance with this detection, the flexible film wiring boards and common wiring board are aligned in position. Accordingly, it is possible to perform the wiring board connection method of this invention. If the common wiring board is made of transparent material, the camera and illumination light source are disposed with the common wiring board being interposed therebetween, and the position alignment marks are detected from light transmitted through the common wiring board. Accordingly, an image can be picked up reliably without being affected by light reflected from the surfaces of the flexible film wiring boards and common wiring board, and so good position alignment becomes possible.

According to the ink jet recording head of this invention, position alignment marks are provided at each of the flexible film wiring boards and common wiring board, and the flexible film wiring boards and common wiring board are electrically connected by the connecting method of this invention. Accordingly, the flexible film wiring boards and common wiring board can be connected reliably and electrical signals can be supplied to the flexible film wiring boards reliably. All the flexible film wiring boards can be connected collectively to the common wiring board without lowering productivity.

According to the ink jet recording apparatus of this invention, since the ink jet recording head of this invention is used, recording liquid can be jetted out reliably in response to electrical signals.

DETAILED DESCRIPTION OF THE PREFERRED EMBODIMENTS

Figure 12:
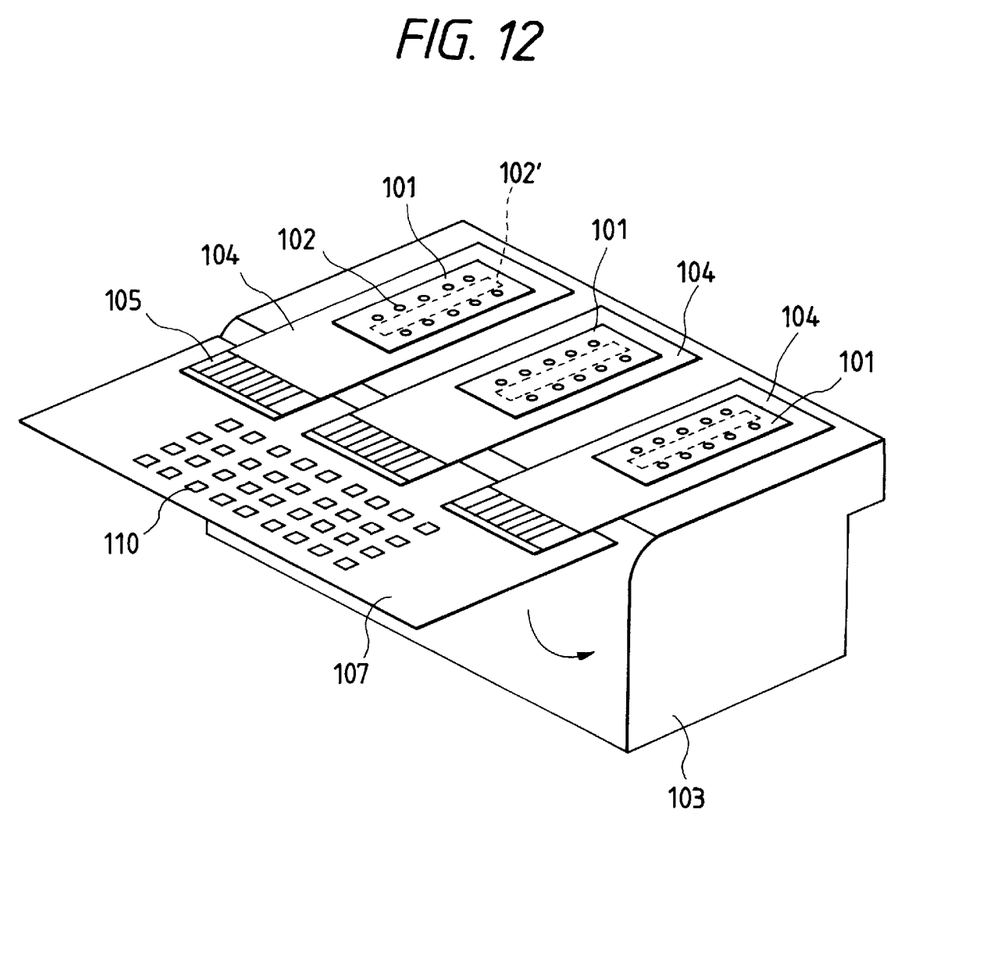
FIG. 12 is a perspective view of an ink jet recording head.

FIG. 12 is a perspective view showing an example of an ink jet recording head of a side shooter type.

As shown in FIG. 12, an ink container 103 containing ink therein has a plurality of juxtaposed recording element boards 101 adhered thereto. Each recording element board 101 has a plurality of jet ports 102 opening at the front surface of the board, a plurality of ink supply ports 102' opening at the back surface thereof for supplying ink in the ink container 103 into the recording element board 101, a plurality of ink paths (not shown) for communicating the ink supply ports 102' with the jet ports 102, and a plurality of electrothermal conversion elements (not shown) each provided for a corresponding jet port 102.

Each recording element board 101 is electrically connected to electric terminals of a corresponding flexible film wiring board 104. The recording element board 101 and flexible film wiring board 104 are interconnected through TAB (Tape Automated Bonding), the recording element board 101 being disposed in an opening of the flexible film wiring board 104. Input terminals 105 of each flexible film wiring board 104 are electrically connected to output terminals (not shown) of a common wiring board 107 having a plurality of external input pads 110 via which electrical signals such as recording information from a recording apparatus main body (not shown) are supplied to the ink jet recording head.

Recent ink jet recording heads with high speed, multi-color and high image quality have a resolution as high as 1000 dpi. A position alignment precision of each recording element board 101 of the ink container 103 is therefore becoming more important, and a high precision such as several $\mu$m to several tens $\mu$m is requested. Furthermore, since each recording element substrate 101 has several hundreds jet ports 102 and hence electrothermal conversion elements, input terminals 105 of the flexible film wiring board 104 and output terminals of the common wiring board 107 are disposed at a pitch of 100 to 500 $\mu$m.

From the reason of high productivity, all flexible film wiring boards 104 are sometimes connected collectively to the single common wiring board 107. In such a case, one of the plurality of flexible film wiring boards 104 is used as a reference for the position alignment with the common wiring board 107, and thereafter electrical connection between the flexible film wiring boards 104 and common wiring board 107 is performed. After the electrical connection is completed, the flexible film wiring boards 104 are bent in an arrow direction to fix the common wiring board 107 to the side wall of the ink container 103.

In connecting all flexible film wiring boards collectively to the single common wiring board, however, the positions of input terminals of each flexible film wiring board may be displaced from those of output terminals of the common wiring board, because of a poor connection position alignment precision between the flexible film wiring board and recording element board, and because of a distortion such as warp and swell of the flexible film wiring board.

Figure 13:
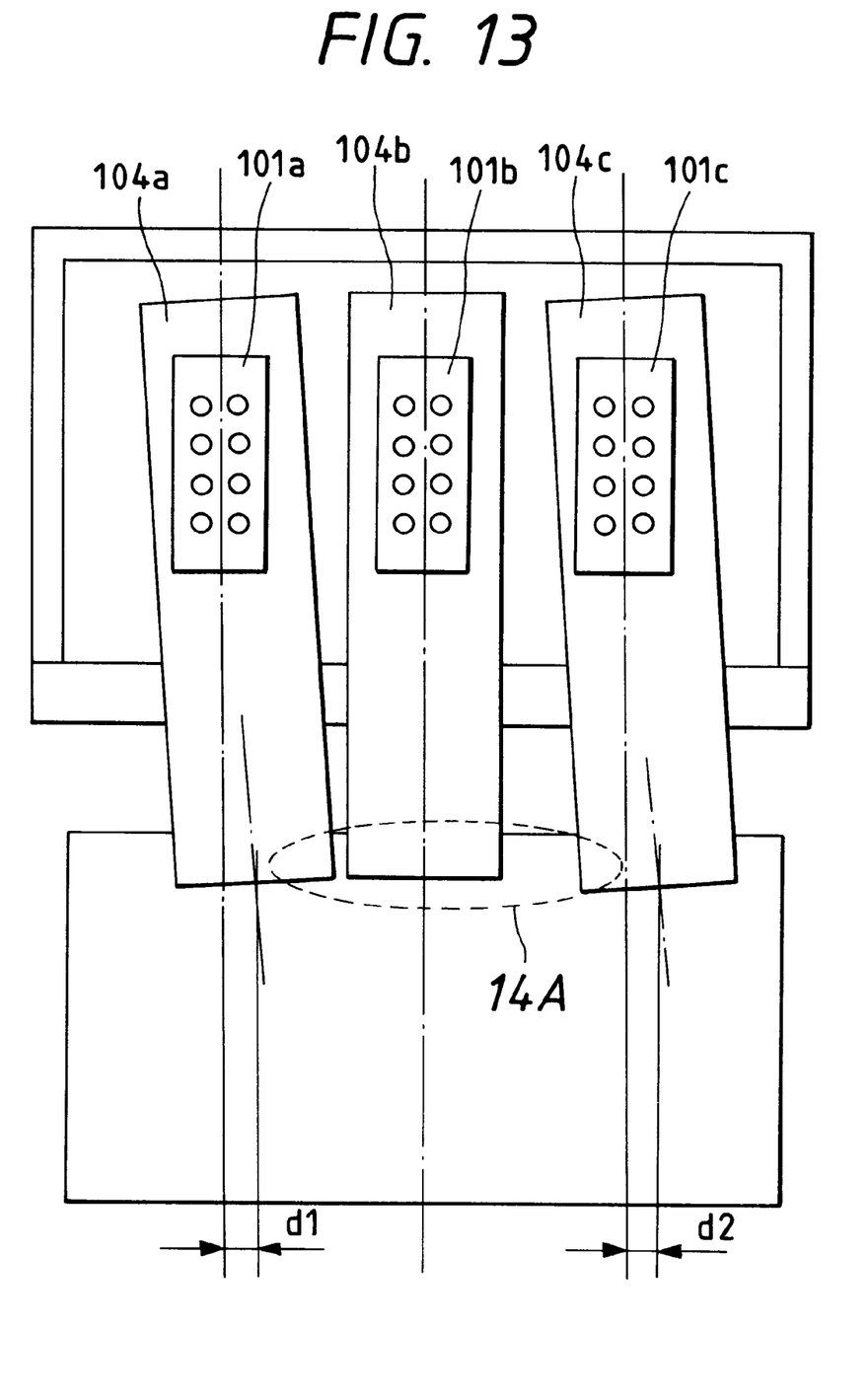
FIG. 13 is a plan view of the ink jet recording head shown in FIG. 12.
Figure 14A:
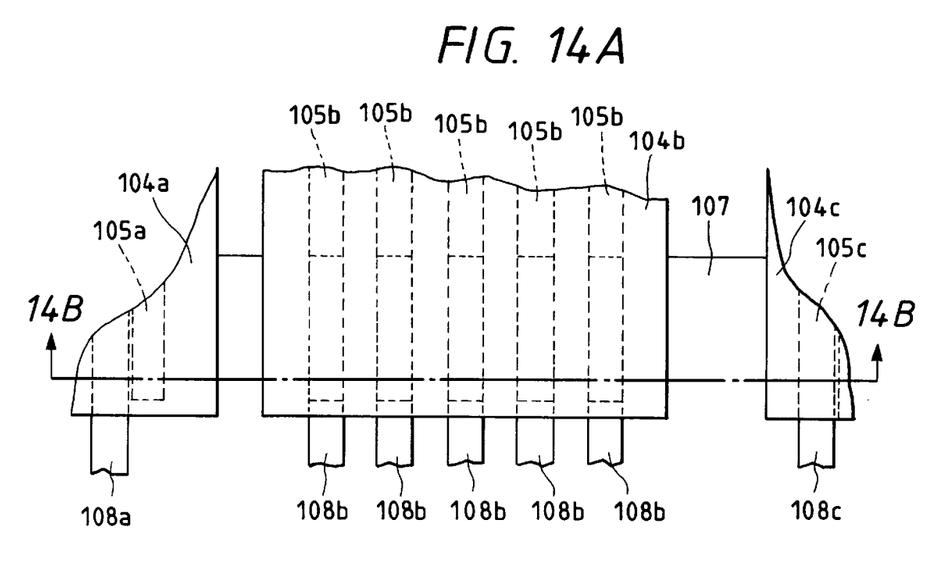
FIGS. 14A and 14B are an enlarged view and a cross sectional view of a portion 14A shown in FIG. 13.
Figure 14B:
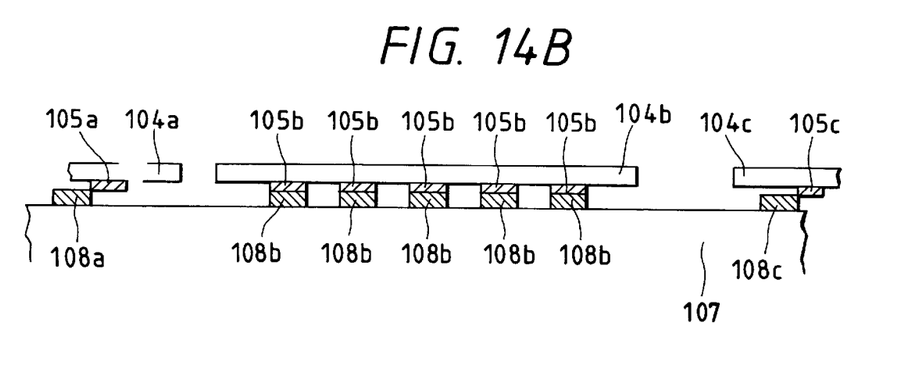

Defects to be caused by such displacement will be described with reference to FIGS. 13, 14A and 14B. FIG. 13 is a plan view of an ink jet recording head of a side shooter type, with some displacement of flexible film wiring boards. FIGS. 14A and 14B are an enlarged view of a 14A part shown in FIG. 13 and its cross sectional view.

As shown in FIG. 13, of the three flexible film wiring boards 104a, 104b and 104c, although the center flexible film wiring board 104b has its center line coincident with the center line of the recording element board 101b, the right and left flexible film wiring boards 104a and 104c have their center lines oblique to those of the recording element substrates 101a and 101c and have displacements d2 and d1 at the end portions thereof.

In such a case, as shown in FIGS. 14A and 14B, if all the flexible film wiring boards 104a, 104b and 104c are collectively connected to the common wiring board 107, with the input terminals 105*b* of the center flexible film wiring board 104*b* being aligned with the corresponding output terminals 108*b* of the common wiring board 107, then the right and left flexible film wiring boards 104*a* and 104*c* are displaced from the corresponding output terminals 108*a* and 108*c*. Depending upon the displacements d2 and d1 of the right and left flexible film wiring boards 104*a* and 104*b*, defects such a s disconnection and short circuit may occur and productivity may be lowered. In the above, although the center flexible film wiring board 104*b* is used as a reference to the position alignment with the common wiring board 107, the above problem may occur even if any one of the flexible film wiring boards is used as a reference for position alignment.

Defects of terminals such as disconnection and short circuit may lower the reliability of electrical signal transmission to recording element boards of an ink jet recording head and may not be possible to normally jet out ink.

Next, embodiments of the present invention will be described with reference to the accompanying drawings.

(First Embodiment)

Figure 1:
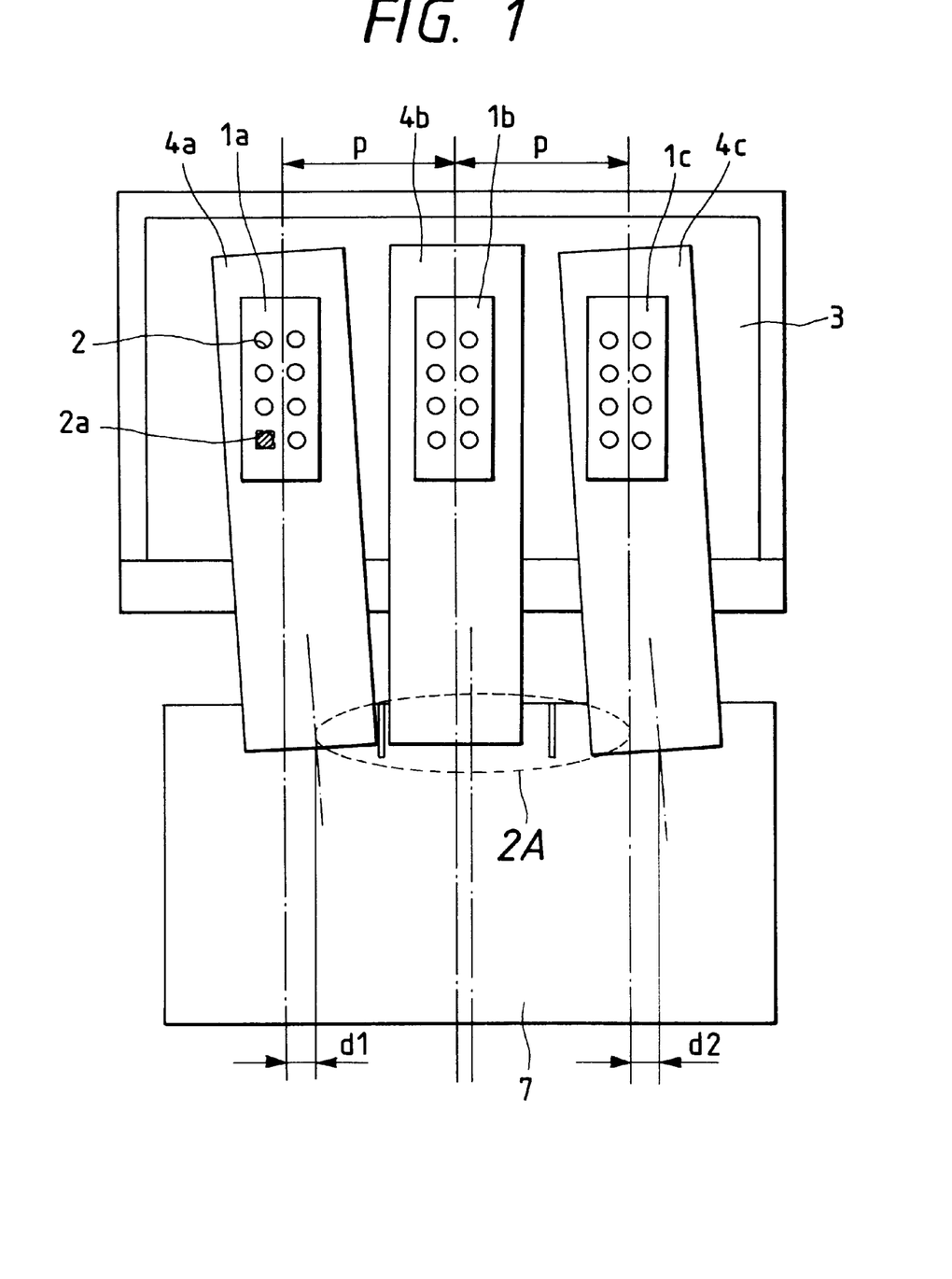
FIG. 1 is a plan view of an ink jet recording head illustrating a first embodiment of the invention.
Figure 2A:
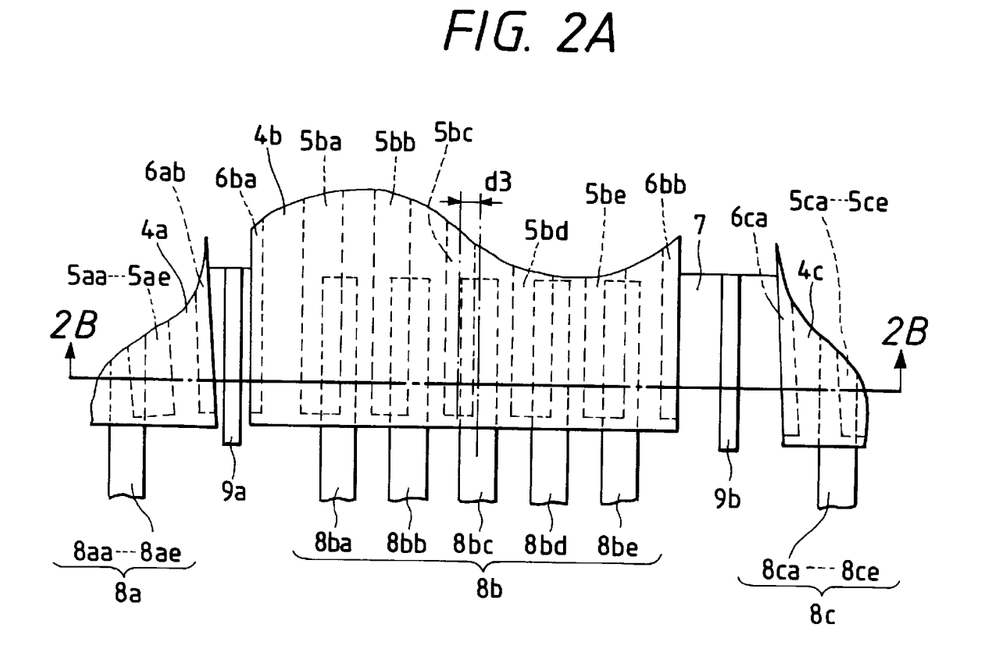
FIGS. 2A and 2B are an enlarged view of a portion 2A of the ink jet recording head shown in FIG. 1 and a cross sectional view thereof taken along line 2B—2B.
Figure 2B:
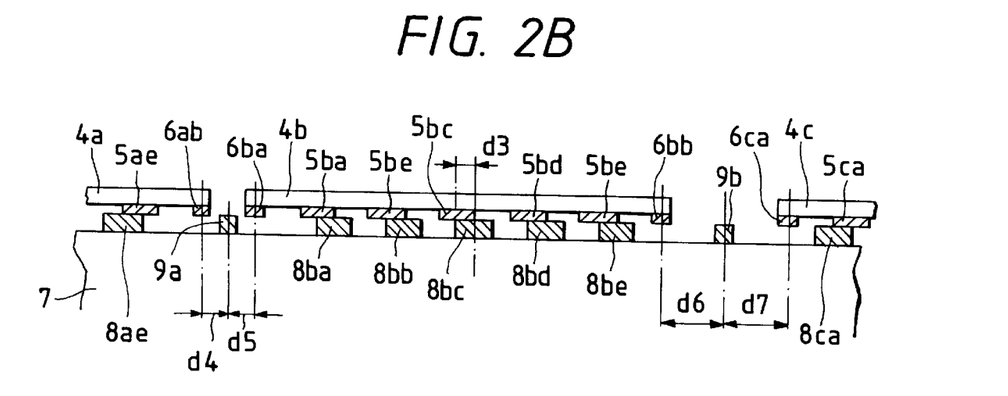

FIG. 1 is a plan view of an ink jet recording head used for explaining the first embodiment of the invention. FIG. 2A and 2B are an enlarged view of a portion 2A of the ink jet recording apparatus shown in FIG. 1, and FIG. 2B is a cross sectional view of the apparatus taken along line 2B—2B.

Similar to an ink jet recording head shown in FIGS. 12 and 13, the ink jet recording head of this embodiment has an ink container 3 as a fixed component, a plurality of recording element substrates 1, 1*b* and 1*c*, a plurality of flexible film wiring boards (first wiring boards) 4*a*, 4*b* and 4*c*, and a common wiring board (second wiring board) 7.

The recording element boards 1*a*, 1*b* and 1*c* each have several tens to several hundreds jet ports 2 at a front surface thereof, and are juxtaposed at an equal pitch p and fixed to the ink container 3. The recording element boards 1*a*, 1*b* and 1*c* each further have a plurality of ink supply ports, ink paths and electrothermal conversion elements (generally indicated at 2*a* in FIG. 1). These components are similar to those of the previously-described ink jet recording head, and so the detailed description thereof is omitted.

Each recording element substrate 1*a*, 1*b*, 1*c* is electrically connected to electrode terminals (not shown) of a corresponding one of flexible film wiring boards 4*a*, 4*b* and 4*c*. The recording element substrates 1*a*, 1*b* and 1*c* and flexible film wiring boards 4*a*, 4*b* and 4*c* are interconnected through TAB (Tape Automated Bonding), the recording element substrates 1*a*, 1*b* and 1*c* being disposed in openings of the flexible film wiring boards 4*a*, 4*b* and 4*c*. Therefore, similar to the recording element boards 1*a*, 1*b* and 1*c*, the flexible film wiring boards 4*a*, 4*b* and 4*c* are fixedly juxtaposed at a constant pitch. An integrated structure of the ink container 3, recording element boards 1*a*, 1*b* and 1*c* and flexible film wiring boards 4*a*, 4*b* and 4*c* is hereinafter called a head unit.

As shown in FIGS. 2A and 2B, the flexible film wiring boards 4*a*, 4*b*, 4*c* have input terminals 5*aa* to 5*ae*, 5*ba* to 5*be*, and 5*ca* to 5*ce* electrically connected to the above-described electrode terminals and extending to the distal end portions of the boards 4*a*, 4*b* and 4*c*. These input terminals 5*aa* to 5*ae*, 5*ba* to 5*be*, and 5*ca* to 5*ce* are electrically connected to output terminals 8*aa* to 8*ae*, 8*ba* to 8*be*, and 8*ca* to 8*ce* of the common wiring board 7. These output terminals 8*aa* to 8*ae*, 8*ba* to 8*be*, and 8*ca* to 8*ce* are disposed at the positions corresponding to the flexible film wiring boards 4*a*, 4*b* and 4*c*, and constitute three output terminal groups 8*a*, 8*b* and 8*c*.

Although only several input terminals 5*aa* to 5*ae*, 5*ba* to 5*be*, and 5*ca* to 5*ce* of the flexible film wiring boards 4*a* and 4*b* and 4*c* and several output terminals 8*aa* to 8*ae*, 8*ba* to 8*be*, and 8*ca* to 8*ce* of the common wiring board 7 are shown in FIGS. 2A and 2B, several tens or more terminals are actually used. Similar to the ink jet recording head shown in FIG. 12, the common wiring board 7 has a plurality of external input pads via which electrical signals such as recording information from a recording apparatus main body (not shown) are supplied to the recording element boards 1*a*, 1*b* and 1*c*, these external input pads being omitted in FIG. 1.

The flexible film wiring boards 4*a*, 4*b* and 4*c* have position alignment terminals 6*ab*, 6*ba*, 6*bb* and 6*ca* as first position alignment marks.

The position alignment terminals 6*ba* and 6*bn* of the center flexible film wiring board 4*b* are formed on both side portions of the board 4*b* and extend to the end portion thereof in the longitudinal direction. The position alignment terminals 6*ca* and 6*ab* of the right and left flexible film wiring boards 4*c* and 4*a* are formed on the sides adjacent to the center flexible film wiring board 4*b* in the manner similar to the center flexible film wiring board 4*b*.

Each of the position alignment terminals 6*ab*, 6*ba*, 6*bb* and 6*ca* has an equal gap to each of the adjacent input terminals 5*ae*, 5*ba*, 5*be* and 5*ca*. Therefore, if the input terminals 5*aa* to 6*ae*, 5*ba* to 5*be*, and 5*ca* to 5*ce* of the flexible film wiring boards 4*a*, 4*b* and 4*c* are correctly aligned in position with the output terminals 8*aa* to 8*ae*, 8*ba* to 8*be*, and 8*ca* to 8*ce*, the center lines of the flexible film wiring boards 4*a*, 4*b* and 4*c* in the width direction become coincident with the center lines of the output terminal groups 8*a*, 8*b* and 8*c* in the width direction. Although these position alignment terminals 6*ab*, 6*ba*, 6*bb* and 6*ca* are formed in the manner similar to the input terminals 5*aa* to 5*ae*, 5*ba* to 5*be*, and 5*ca* to 5*ce*, they are dummy terminals not connected to the recording element boards 1*a*, 1*b* and 1*c*.

The common wiring board 7 also has position alignment terminals 9*a* and 9*b* as second position alignment marks at the positions between the output terminal groups 8*a* and 8*b* and between the output terminal groups 8*b* and 8*c*. Each of the position alignment terminals 9*a* and 9*b* has an equal gap to each of the adjacent output terminals 8*ae*, 8*ba*, 8*be*, and 8*ca*. Although these position alignment terminals 9*a* and 9*b* are formed in the manner similar to the output terminals 8*aa* to 8*ae*, 8*ba* to 8*be*, and 8*ca* to 8*ce*, they are dummy terminals not connected to the external input pads.

The provision of these position alignment marks as terminals makes it unnecessary to prepare a particular process of forming position alignment marks during the manufacture processes of the flexible film wiring boards 4*a*, 4*b* and 4*c* and the common wiring board 7, and the flexible film wiring boards 4*a*, 4*b* and 4*c* and common wiring board 7 can be manufactured as described previously, if only a mask pattern for position alignment marks is prepared.

The position alignment terminals 6*ab*, 6*ba*, 6*bb*, 6*ca*, 9*a* and 9*b* are used for the position alignment of the flexible film wiring boards 4*a*, 4*b* and 4*c* and common wiring board 7. A method of connecting together the flexible film wiring boards 4*a*, 4*b* and 4*c* and the common wiring board 7 will be described.

Consider now that as shown in FIG. 1, of the three flexible film wiring boards 4*a*, 4*b* and 4*c*, although the center flexible film wiring board 4*b* has its center line coincident with the center line of the recording element board 1*b*, the right and left flexible film wiring boards 4*c* and 4*a* have their center lines oblique to the center lines of the recording element boards 1c and 1a with displacements d2 and d1 at their end portions. It is assumed that these displacements d2 and d1 are larger than the width of each of the input terminals 5aa to 5ae, 5ba to 5be, and 5ca to 5ce of the flexible film wiring boards 4a, 4b and 4c.

Figure 3:
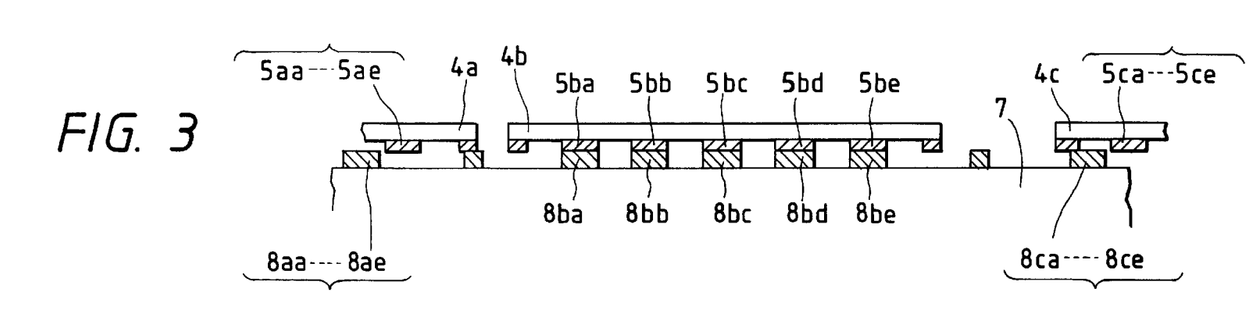
FIG. 3 is a cross sectional view showing the main part of the ink jet recording head shown in FIG. 1 wherein the center flexible film wiring board is aligned with a common wiring board.

In this case, as shown in FIG. 3, if all the flexible film wiring boards 4a, 4b and 4c are collectively connected to the common wiring board 7 after the input terminals 5ba to 5be of the center flexible film wiring board 4b are aligned with the corresponding output terminals 8ba to 8be, then the positions of the right and left flexible film wiring boards 4c and 4a are displaced relative to the positions of the corresponding output terminals 8aa to 8ae, and 8ca to 8ce. Therefore, the input terminals 5ca to 5ce, and 5aa to 5ae of the right and left flexible film wiring boards 4c and 4a are not electrically connected.

In this embodiment, therefore, as shown in FIGS. 2A and 2B, the head unit and the common wiring board 7 are aligned in position so as to make the largest gap as small as possible, among those gaps including: a gap d4 between the position alignment terminal 6ab of the left flexible film wiring board 4a and the left position alignment terminal 9a of the common wiring board 7; a gap d5 between the left position alignment terminal 6ba of the center flexible film wiring board 4b and the left position alignment terminal 9a of the common wiring board 7; a gap d6 between the right position alignment terminal 6bb of the center flexible film wiring board 4b and the right position alignment terminal 9b of the common wiring board 7; and a gap d7 between the position alignment terminal 6ca of the right flexible film wiring board 4c and the right position alignment terminal 9b of the common wiring board 7. More specifically, the head unit and the common wiring board 7 are aligned in position so as to make the gaps d4 and d5 generally equal and the gaps d6 and d7 generally equal.

However, since each of the position alignment terminals 6ab, 6ba, 6bb, 6ca, 9a and 9b has a width, some gap cannot be determined definitely if each of the position alignment terminals 6ab, 6ba, 6bb, and 6ca of the flexible film wiring boards 4a, 4b and 4c overlaps one of the position alignment terminals 9a and 9b of the common wiring board 7 although this overlap depends on the displacement amount of the flexible film wiring boards 4a, 4b and 4c. It is therefore preferable to determine each gap by using as references the centers of the position alignment terminals 6ab, 6ba, 6bb, 6ca, 9a and 9b in the width direction.

With the above position alignment, the center flexible film wiring board 4b is displaced from the normal position. By representing this displacement by d3, the left flexible film wiring board 4a has a displacement amount (d1−d3) relative to the normal position, and the right flexible film wiring board 4c has a displacement amount (d2−d3) relative to the normal position. Accordingly, the displacement of the right and left flexible film wiring boards 4c and 4a is absorbed by the center flexible film wiring board 4b, so that the input terminals 5aa to 5ae, 5ba to 5be, and 5ca to 5ce of the flexible film wiring boards 4a, 4b and 4c can be made in contact with the output terminals 8aa to 8ae, 8ba to 8be, and 8ca to 8ce of the wiring board 7.

After the head unit and common wiring board 7 are aligned in position in the above manner, all the flexible film wiring boards 4a, 4b and 4c are collectively connected to the common wiring board with solder. It is therefore possible to properly interconnect all the flexible film wiring boards 4a, 4b and 4c and common wiring board 7 without lowering productivity. The ink jet recording head can therefore be supplied reliably with electric signals such as recording information from the recording apparatus main body, and ink is jetted out reliably.

The above-described position alignment may become impossible depending upon the slant angles between the center lines of the recording element boards 1a, 1b and 1c and the flexible film wiring boards 4a, 4b and 4c.

For example, it is assumed that each of the output terminals 8aa to 8ae, 8ba to 8be, and 8ca to 8ce of the common wiring board 7 and the input terminals 5aa to 5ae, 5ba to 5be, and 5ca to 5ce of the flexible film wiring boards 4a, 4b and 4c has a width W of 175 $\mu$m and is disposed at a pitch P of 350 $\mu$m, and that a difference between a gap (d4+d5) between the position alignment terminal 6ab of the left flexible film wiring board 4a and the left position alignment terminal 6aa of the center flexible film wiring board 4b and a gap (d6+d7) between the right position alignment terminal 6ca of the center flexible film wiring board 4b and the position alignment terminal 6ca of the right flexible film wiring board 4c is larger than W+P=350 $\mu$m+175 $\mu$m=525 $\mu$m. In this case, geometric position alignment is impossible.

It is therefore preferable to measure these gaps before the final position alignment, and if a difference between these gaps is larger than a value of the terminal width W added to the layout pitch P, not to perform the final position alignment by judging that the head unit is not adequate. A slight displacement between the flexible film wiring boards 4a, 4b and 4c and the common wiring board 7 may be formed at the connection process after the position alignment. Therefore, in order to ensure more reliable connection, this displacement should also be taken into account when a value as a reference of judging an inadequate head unit is determined. For example, in the above case, it is preferable in terms of reliable connection that the head unit should be judged as inadequate if the difference between gaps is larger than 350 $\mu$m.

(Second Embodiment)

Figure 4:
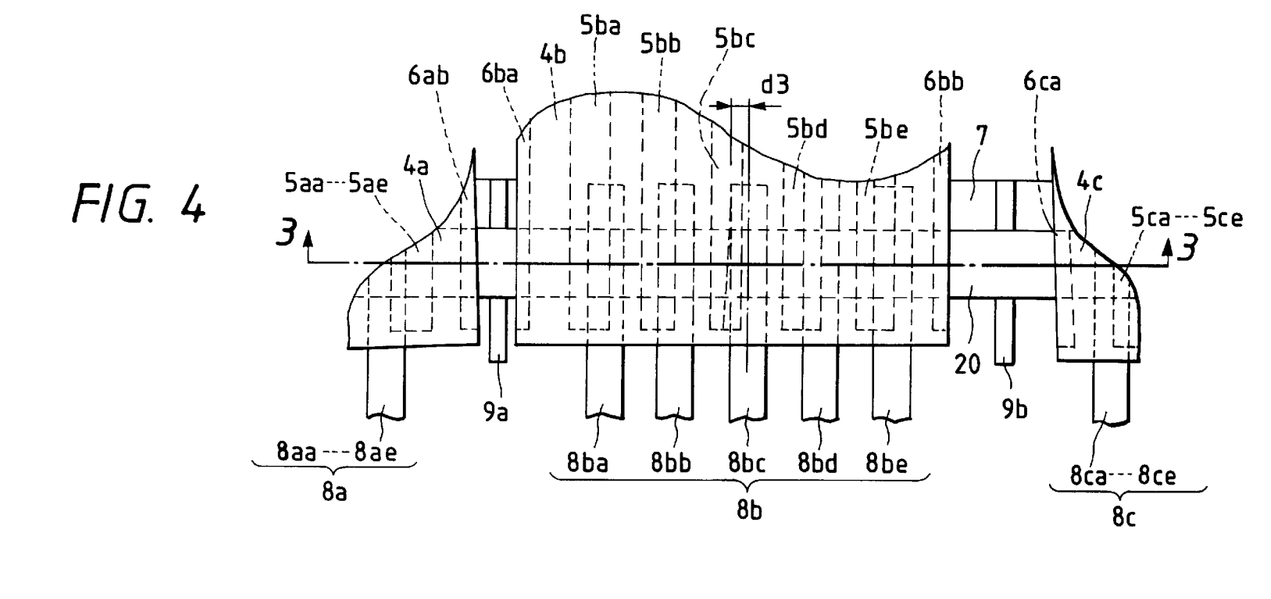
FIG. 4 is a plan view showing a connection portion between flexible film wiring boards and a common wiring board according to a second embodiment of the invention.

FIG. 4 is a plan view showing a connection portion between flexible film wiring boards and a common wiring board, and being used for explaining the second embodiment of the invention.

The flexible film wiring boards 4a, 4b and 4c and the common wiring board 7 shown in FIG. 4 are used with an ink jet recording head similar to that shown in FIG. 1, and correspond to those shown in FIGS. 2A and 2B. In FIG. 4, like elements to those shown in FIGS. 2A and 2B are represented by using identical reference numerals, and the detailed description thereof is omitted.

In this embodiment, an anisotropic conductive adhesive member (AFC) 20 of a striped shape is used for the connection of the flexible film wiring boards 4a, 4b and 4c and common wiring board 7. As shown in a cross sectional view of FIG. 6B, the anisotropic conductive adhesive member 20 is made of thermosetting adhesive 21 dispersed with conductive particles 22. The other structure is the same as the first embodiment.

Figure 5:
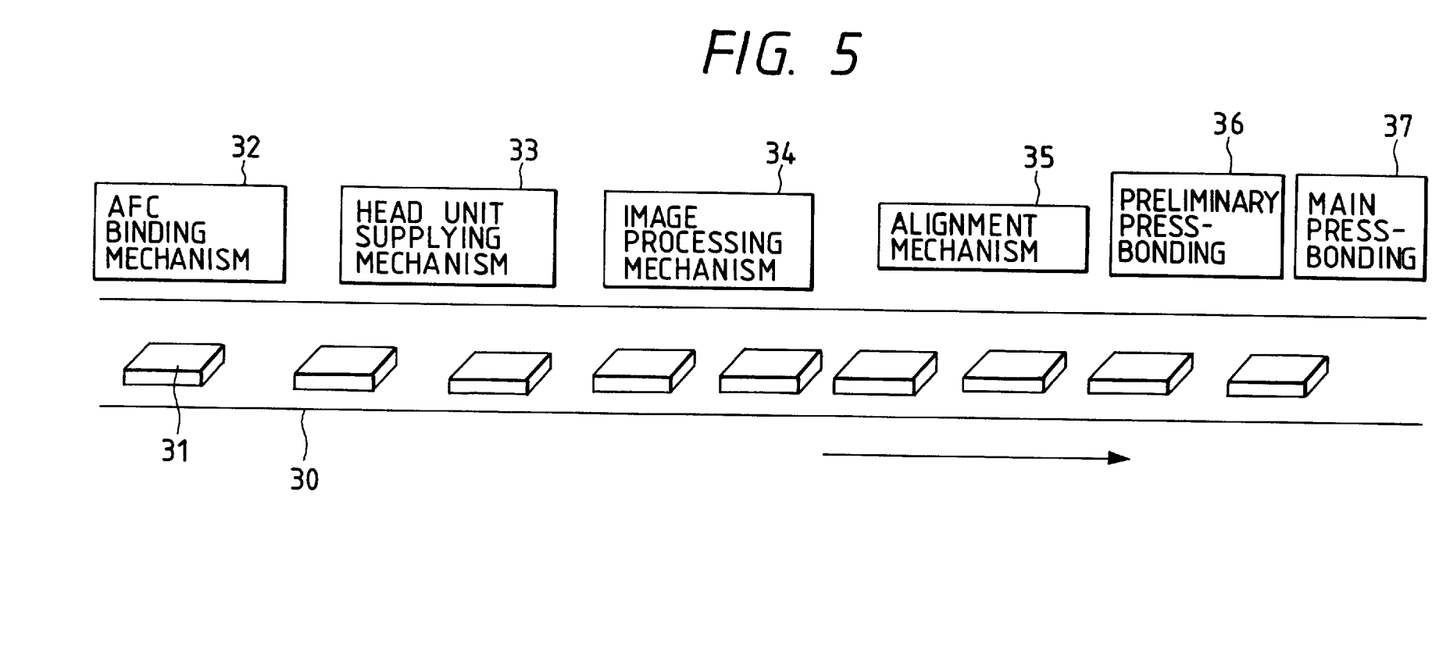
FIG. 5 is a schematic diagram showing an example of the structure of a wiring board connecting apparatus for interconnecting flexible film wiring boards and a common wiring board shown in FIG. 4.

An example of a wiring board connecting apparatus for the connection of the flexible film wiring boards 4a, 4b and 4c and common wiring board 7 shown in FIG. 4 will be described with reference to FIGS. 4 and 5.

This wiring board connecting apparatus is constituted of an AFC binding mechanism 32, a head unit supplying mechanism 33, an image processing mechanism 34, an alignment mechanism 35, a preliminary press-bonding mechanism 36, and a main press-bonding mechanism 37. The AFC binding mechanism 32 is used for placing the anisotropic conductive adhesive member 20 on the output terminals 8*aa* to 8*ae*, 8*ba* to 8*be* and 8*ca* to 8*ce* of the common wiring board 7. The head unit supplying mechanism 33 is used for supplying the head unit. The image processing mechanism 34 is used for taking with a camera an image of a connection portion between the flexible film wiring boards 4*a*, 4*b* and 4*c* of the head unit and the common wiring board 7 and for performing a calculation process described with the first embodiment. The alignment mechanism 35 is used for obtaining a relative motion between the head unit and the common wiring board 7 in accordance with the calculation result given by the image processing mechanism 34. The preliminary press-bonding mechanism 36 is used for performing preliminary press-bonding between the flexible film wiring boards 4*a*, 4*b* and 4*c* of the head unit and the common wiring board 7 both aligned in position by the alignment mechanism 35. The main-press bonding 37 is used for heating and bonding the flexible film wiring boards 4*a*, 4*b* and 4*c* of the head unit and the common wiring board 7 subjected to the preliminary press-bonding, to thereby electrically connect the terminals of the boards 4*a*, 4*b*, 4*c* and 7.

These mechanisms are sequentially mounted along a conveyer 30 having a plurality of pallets and moving in the arrow direction. A common wiring board 7 is first placed on the pallet 31, and as this pallet 31 passes by each mechanism, the common wiring board 7 and head unit on the pallet 31 are processed by each mechanism.

Next, a procedure of interconnecting the flexible film wiring boards 4*a*, 4*b* and 4*c* and common wiring board 7 of this embodiment will be described with reference to FIGS. 6A to 10, taking as an example the case wherein the positional relation of the flexible film wiring boards 4*a*, 4*b* and 4*c* is the same as that shown in FIG. 1.

Figure 6A:
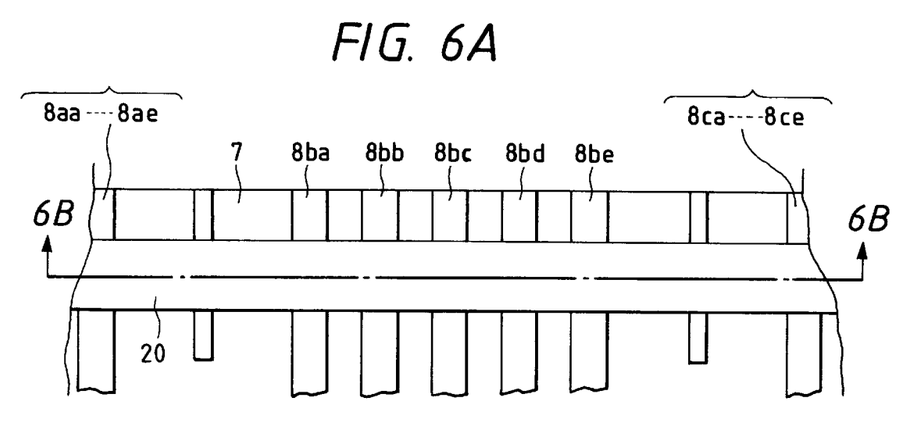
FIGS. 6A and 6B are a plan view and a cross sectional view showing the common wiring board of FIG. 4 attached with an isotropic conductive adhesive member, and illustrating a procedure of interconnecting the flexible film wiring boards and common wiring board shown in FIG. 4.
Figure 6B:
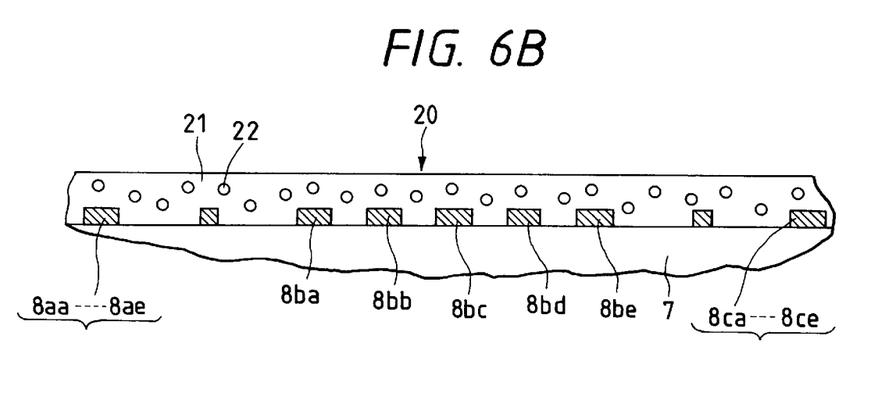

First, as shown in FIGS. 6A and 6B, the AFC binding mechanism 32 attaches the anisotropic conductive adhesive member 20 on the output terminals 8*aa* to 8*ae*, 8*ba* to 8*be*, and 8*ca* to 8*ce* of the common wiring board 7 along the direction traversing these output terminals.

Figure 7A:
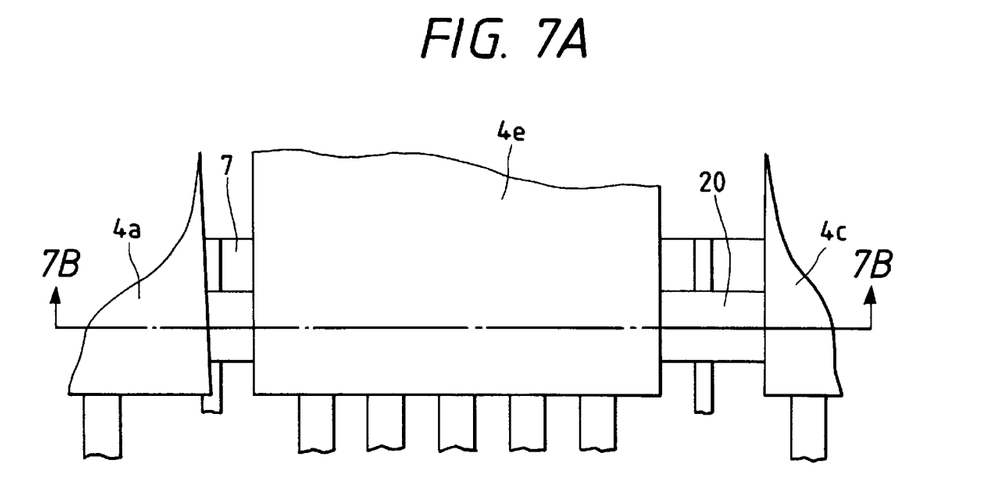
FIGS. 7A and 7B are a plan view and a cross sectional view showing the flexible film wiring boards mounted on the common wiring board, and illustrating a procedure of interconnecting the flexible film wiring boards and common wiring board shown in FIG. 4.
Figure 7B:
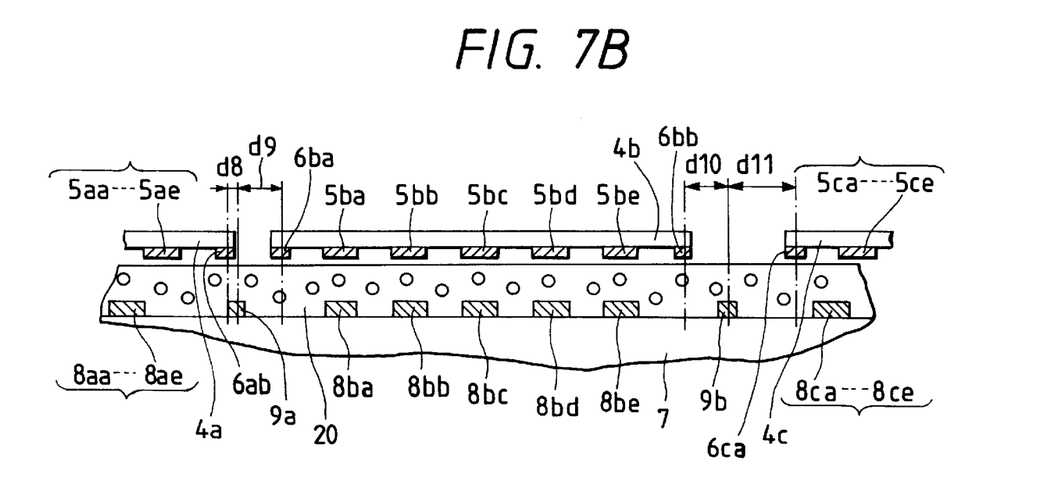

Next, as shown in FIGS. 7A and 7B, the head supplying mechanism 33 supplies a head unit by positioning the end portions of the flexible film wiring boards 4*a*, 4*b* and 4*c* above the anisotropic conductive adhesive member 20, with the center line of the head unit in the width direction being made coincident with the center line of the common wiring board 7 in the width direction.

After the head unit is supplied, the camera of the image processing mechanism 34 takes an image of the position alignment terminals 6*ab*, 6*ba*, 6*bb* and 6*ca* of the flexible film wiring boards 4*a*, 4*b* and 4*c* and the position alignment terminals 9*a* and 9*b* of the common wiring board 7. In accordance with the picked-up image, a calculation unit of the image processing mechanism 34 calculates gaps shown in FIG. 7B including: a gap d8 between the position alignment terminal 6*ab* of the left flexible film wiring board 4*a* and the left position alignment terminal 9*a* of the common wiring board 7; a gap d9 between the left position alignment terminal 6*ba* of the center flexible film wiring board 4*b* and the left position alignment terminal 9*a* of the common wiring board 7; a gap d10 between the right position alignment terminal 6*bb* of the center flexible film wiring board 4*b* and the right position alignment terminal 9*b* of the common wiring board 7; and a gap d11 between the position alignment terminal 6*ca* of the right flexible film wiring board 4*c* and the right position alignment terminal 9*b* of the common wiring board 7. Each gap is calculated by using as a reference the center in the width direction of each of the position alignment terminals 6*ab*, 6*ba*, 6*bb*, 6*ca*, 9*a* and 9*b*.

If the common wiring board 7 is made of transparent material such as epoxy glass, an illumination light source is disposed under the common wiring board 7 and the image of the position alignment terminals 6*ab*, 6*ba*, 6*bb*, 6*ca*, 9*a* and 9*b* is taken with the camera positioned above the flexible film wiring boards. In this manner, the image can be taken reliably without being affected by light reflected from the surface of the flexible film wiring boards 4*a*, 4*b* and 4*c*. The positions of the camera and illumination light source may be reversed.

Figure 8A:
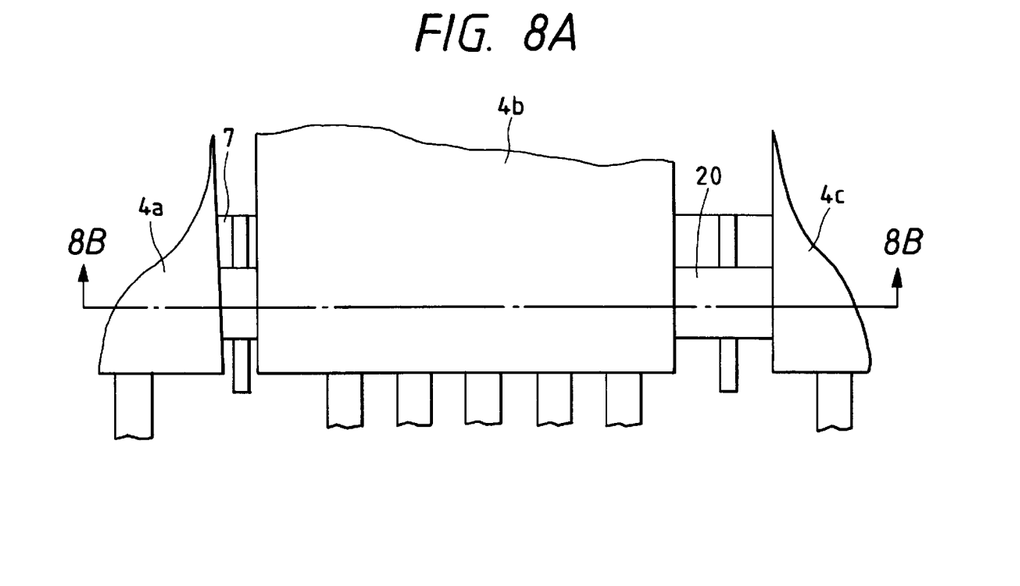
FIGS. 8A and 8B are a plan view and a cross sectional view showing the flexible film wiring boards aligned with the common wiring board, and illustrating a procedure of interconnecting the flexible film wiring boards and common wiring board shown in FIG. 4.
Figure 8B:
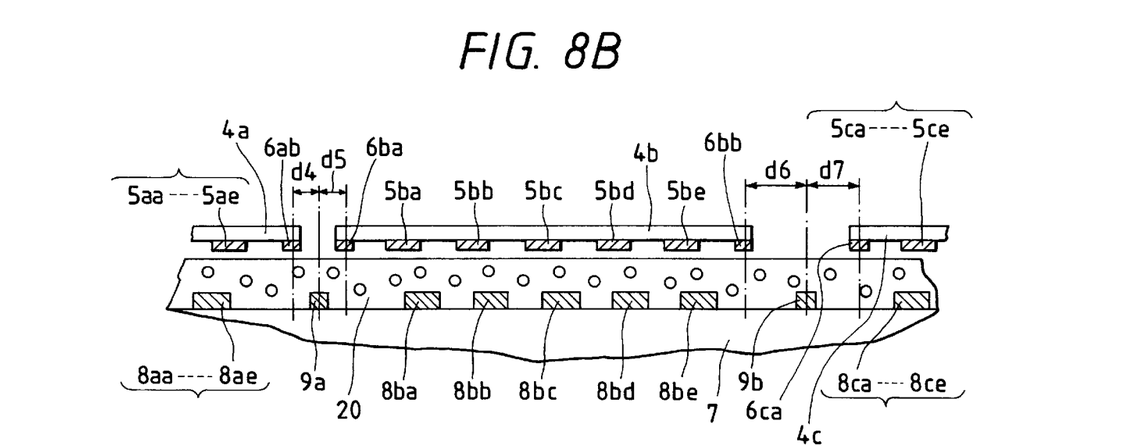

Next, as shown in FIGS. 8A and 8B, the alignment mechanism 35 gives a relative motion of the head unit and common wiring board 7 so that a gap d4 between the position alignment terminal 6*ab* of the left flexible film wiring board 4*a* and the left position alignment terminal 9*a* of the common wiring board 7 becomes generally equal to a gap d5 between the left position alignment terminal 6*ba* of the center flexible film wiring board 4*b* and the left position alignment terminal 9*a* of the common wiring board 7, and so that a gap d6 between the right position alignment terminal 6*bb* of the center flexible film wiring board 4*b* and the right position alignment terminal 9*b* of the common wiring board 7 becomes generally equal to a gap d7 between the position alignment terminal 6*ca* of the right flexible film wiring board 4*c* and the right position alignment terminal 9*b* of the common wiring board 7.

If such position alignment is impossible as described with the first embodiment, a process by the alignment mechanism 35 is not performed, but the head unit is judged as inadequate and removed from this connecting apparatus. This is preferable from the viewpoint of manufacture efficiency.

Figure 9:
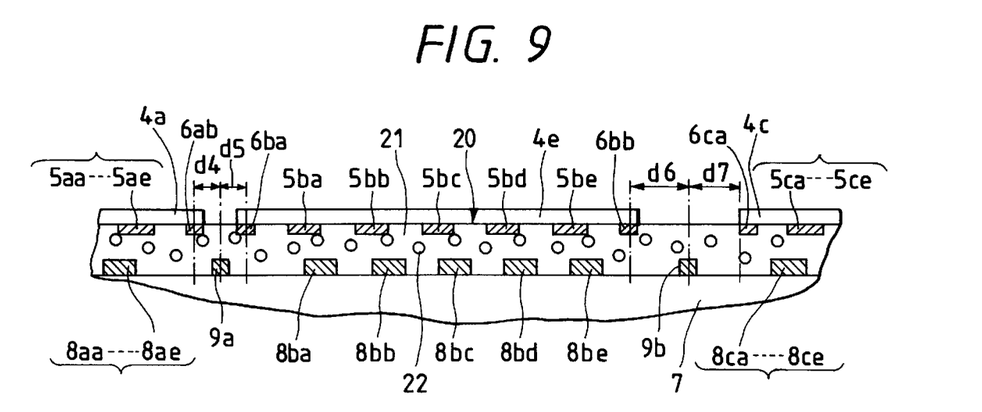
FIG. 9 is a cross sectional view showing the flexible film wiring boards temporarily bonded to the common wiring board, and illustrating a procedure of interconnecting the flexible film wiring boards and common wiring board shown in FIG. 4.

After the head unit and common wiring board 7 are aligned in position, as shown in FIG. 9 the preliminary press-bonding mechanism 36 preliminarily bonds the flexible film wiring boards 4*a*, 4*b* and 4*c* to the anisotropic conductive adhesive member 20 on the common wiring board 7 while applying a pressure at a predetermined temperature. For example, an isotropic conductive adhesive member 20 made of thermosetting adhesive 21 whose main components are epoxy resin was used, and press-bonding was performed for 0.5 to 5 seconds at a temperature of 100 to 150° C. and a pressure of 1 to 4 MPa to temporarily bond the common wiring board 7 to the head unit. This ink container of this head unit was grasped by a handling mechanism and removed from the temporary press-bonding mechanism 36. Any peel-off at the temporary press-bonded portion was not observed.

Figure 10:
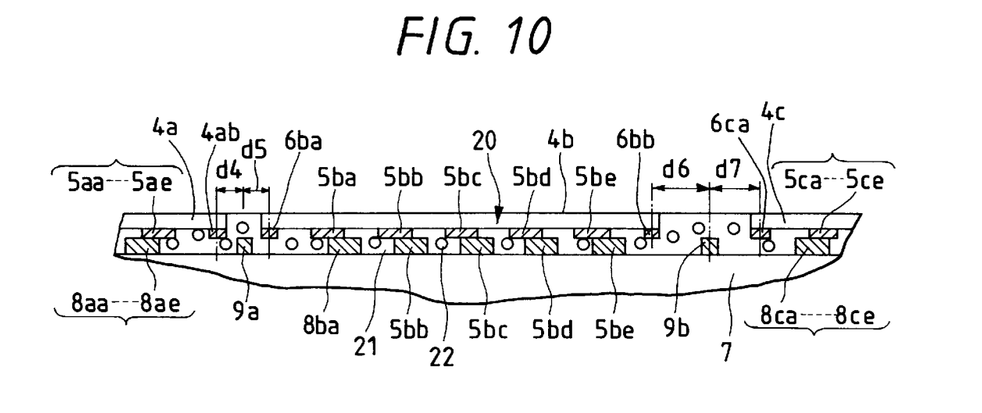
FIG. 10 is a cross sectional view showing the flexible film wiring boards electrically connected and fixed to the signal wiring board, and illustrating a procedure of interconnecting the flexible film wiring boards and common wiring board shown in FIG. 4.

Next, as shown in FIG. 10, the main press-bonding mechanism 37 press-bonds the flexible film wiring boards 4*a*, 4*b* and 4*c* to the common wiring board 7 at a higher pressure and a higher temperature. As a result, the output terminals 8*aa* to 8*ae*, 8*ba* to 8*be*, and 8*ca* to 8*ce* of the common wiring board 7 and the input terminals 5*aa* to 5*ae*, 5*ba* to 5*be*, and 5*ca* to 5*ce* of the flexible film wiring boards 4*a*, 4*b* and 4*c* are electrically connected directly or via conductive particles 22 contained in the anisotropic conductive adhesive member 20 and crushed by the pressure. For example, an anisotropic conductive adhesive member 20 made of thermosetting adhesive 21 containing epoxy resin as its main components and dispersed with conductive particles 22 of nickel having a single particle diameter of 2 to 6 µm was used, and the gold-plated output terminals 8*aa* to 8*ae*, 8*ba* to 8*be*, and 8*ca* to 8*ce* of the common wiring board 7 and the gold-plated input terminals 5*aa* to 5*ae*, 5*ba* to 5*be*, and 5*ca* to 5*ce* of the flexible film wiring boards 4*a*, 4*b* and 4*c* were heat-bonded together for 5 to 20 seconds at a temperature of 170 to 250° C. and a pressure of 4 to 8 MPa.

Electrically good connection was obtained, with each terminal (175 μm wide) having 10 mΩ or smaller.

In this embodiment, the flexible film wiring boards 4a, 4b and 4c are connected to the common wiring board 7 without using solder. Defects to be caused by solder can therefore be eliminated, such as clogged jet ports of a recording element board to be caused by flux scattered during soldering, lowered water repellency of a surface near a jet port to be caused by molecules of ion gas generated from residual flux after soldering, and lowered thermal conversion efficiency to be caused by ion gas molecules entered a jet port and attached to an electrothermal conversion element.

In each of the above embodiments, the displacement amount between each center line of the flexible film wiring boards 4a, 4b and 4c and each corresponding center line of the recording element boards 1a, 1b and 1c is taken into consideration for position alignment. It can be presumed from geometrical viewpoint that other displacement amounts may also be used when all the flexible film wiring boards 4a, 4b and 4c are collectively connected to the common wiring board 7 by using the position alignment terminals 6ab, 6ba, 6bb and 6ca of the flexible film wiring boards 4a, 4b and 4c and the position alignment terminals 9a and 9b of the common wiring board 7 and by aligning the output terminals 8aa to 8ae, 8ba to 8be, and 8ca to 8ce of the common wiring board 7 with the input terminals 5aa to 5ae, 5ba to 5be, and 5ca to 5ce of the flexible film wiring boards 4a, 4b and 4c.

Also in each of the above embodiments, although three flexible film wiring boards 4a, 4b and 4c are collectively connected to the common wiring board 7, the number of flexible film wiring boards may take any value. For example, if N flexible film wiring boards are to be connected to the common wiring board, an outer position alignment terminal is not necessary for the two outermost flexible film wiring boards, and two position alignment terminals at opposite ends are necessary for the other flexible film wiring boards. Therefore, a total of (2N−2) position alignment terminals are required. On the other hand, (N−1) position alignment terminals are required for the common wiring board, each being disposed between adjacent flexible film wiring boards.

Since the position alignment terminals of the flexible film wiring boards and common wiring board are not required to have a function of electrical connection, other materials may be used so long as it allows a position detection with optical means or the like.

The advantageous effects of this invention can be realized not only by a side shooter type ink jet recording head, but also by an edge shooter type ink jet recording head. Various types of recording media on which the ink jet recording head of this invention prints out data may be used, such as paper, yarn, fabric, cloth, leather, metal, plastic, glass, wood, and ceramics. Recording liquid is not limited only to ink, but any other material may be used so long as it can be jetted out and used for printing data on the above recording media.

(Ink Jet Recording Apparatus)

Next, an ink jet recording apparatus mounted with the ink jet recording head described above will be explained.

Figure 11:
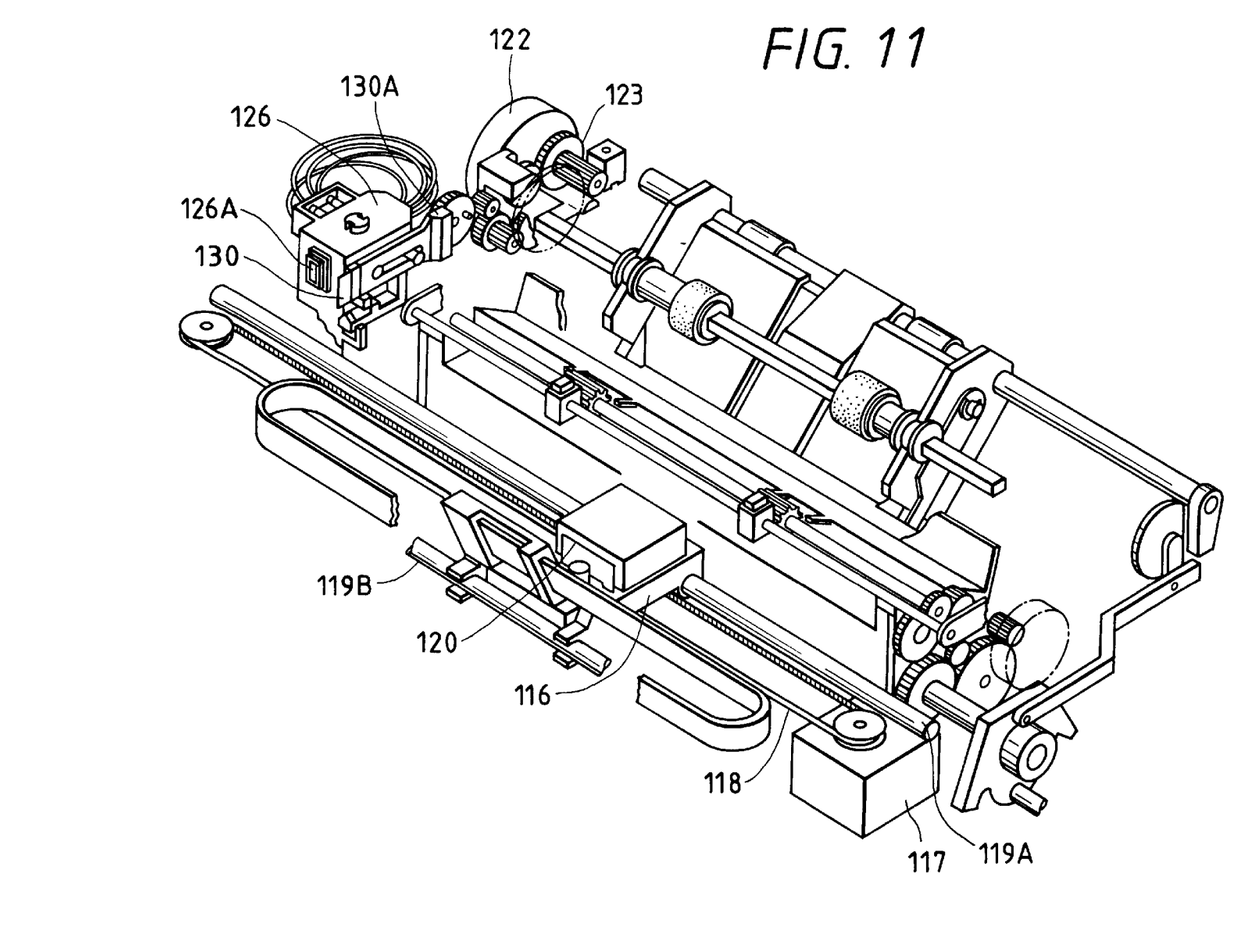
FIG. 11 is a perspective view showing an example of an ink jet recording apparatus mounted with an ink jet recording head of this invention as an ink jet head cartridge 2.

FIG. 11 is a perspective view showing an example of an ink jet recording apparatus mounted with the ink jet recording head of this invention in the form of ink jet head cartridge.

Referring to FIG. 11, a carriage 116 is slidably mounted on two guide shafts 119A and 119B disposed in parallel. Detachably mounted on this carriage 116 is an ink jet head cartridge 120 having an integrated structure of the ink jet recording head described with the embodiments and an ink tank. As the ink jet head cartridge 120 is mounted on the carriage 116, external input pads of the common wiring board of the ink jet recording head are pressed against electrode pads of the carriage 116 so that electrical connection is established therebetween and electrical signals such as recording information can be input to the recording element board.

The ink container 3 (refer to FIG. 1) of the ink jet recording head communicates with the ink tank so that ink is supplied from the ink tank to the ink container 3. The ink jet recording head and ink tank may be configured separately or integrally. The carriage 116 is coupled to a partial area of a drive belt 118 which transmits a drive force supplied from a drive motor 117. As the drive motor 117 is rotated in the normal or reverse direction, the ink jet head cartridge 120 can be reciprocally moved along the guide shafts 119A and 119B.

A head recovery unit 126 is mounted at the position facing one end (e.g., home position) of a motion range of the ink jet head cartridge 120. The head recovery unit 126 is driven by a drive force supplied from a motor 122 via a transmission mechanism 123 to perform capping of the ink jet recording head of the ink jet head cartridge 120. For the capping of the ink jet recording head by a cap 126A of the head recovery unit 126, suction means provided in the head recovery unit 126 sucks ink or pressure means provided in an ink supply path of the ink jet recording head moves ink out of the jet port with applied pressure, to thereby forcibly discharge ink from the jet port. In this manner, a jet recovery process such as removal of high viscosity ink in the jet port can be performed. The capping is performed when recording is terminated or at other timings, in order to protect the ink jet recording head.

A blade 130 as a wiping member made of silicon rubber is mounted on the side wall of the head recovery unit 120. The blade 130 is supported by a blade supporter 130A by using a cantilever. The blade 130 is driven by the motor 122 and transmission mechanism 123, like the head recovery unit 126, and can be made in contact with the jet plane of the ink jet recording head. The blade 130 is projected into a motion path of the ink jet recording head at proper timings during recording or after the jet recovery process by the head recovery unit 126, and wipes out dew drops, wet, dust and the like while the ink jet head cartridge 120 moves.

The above-described ink jet recording apparatus can be used with industrial recording apparatuses combined with a printer, a copier, a facsimile with a communications system, a word processor with a printer unit, or any information processing apparatus.

What is claimed is:

1. A wiring board connecting method of electrically connecting a plurality of first wiring boards juxtaposed side by side each having terminals at one end, to a second common wiring board having a plurality of terminal groups to be connected to the terminals of the first wiring boards, comprising the steps of:

provideing a first position alignment mark at each side area of each of the first wiring boards and a second position alignment mark at each area between adjacent terminal groups of the second wiring board;

after the first and second wiring boards are superposed to make the areas provided with the first and second position alignment marks face one another, aligning the first wiring boards with the second wiring board so as to make the largest gap between the first and second position alignment marks as small as possible; and electrically connecting the first wiring boards to the second wiring board.

2. A wiring board connecting method according to claim 1, wherein prior to said aligning step, an anisotropic conductive adhesive member made of thermosetting adhesive dispersed with conductive particles is attached to the terminals of the second wiring boards, and at said connecting step, the first and second wiring boards are thermally press-bonded.

3. A wiring board connection method according to claim 1, wherein the first wiring board is made of a flexible film.

4. A wiring board connecting method according to claim 1, wherein said first wiring boards and said second wiring boards are part of an ink jet recording head, and said ink jet recording head has a plurality of recording element boards juxtaposed side by side and fixed to a fixed member each having jet ports from which liquid is jetted out, and said first wiring boards are each electrically connected to each said recording element board.

5. A wiring board connecting method according to claim 4, wherein the fixed member is a liquid container for containing liquid to be supplied to the recording element board.

6. A wiring board connecting method according to claim 4, wherein the first position alignment mark is a dummy mark not electrically connected to other terminals.

7. A wiring board connecting method according to claim 4 or 5, wherein the second position alignment mark is a dummy mark not electrically connected to other terminals.

8. A wiring board connecting method according to claim 4, wherein the terminals of the first and second wiring boards are electrically connected via an anisotropic conductive member made of thermosetting adhesive dispersed with conductive particles.

9. A wiring board connecting method according to claim 4, wherein the first wiring board is made of a flexible film.

10. A wiring board connecting method according to claim 4, further comprising an electrothermal conversion element for generating heat energy to be used for jetting liquid out of the jet port.

11. A wiring board connecting method according to claim 4, wherein the ink head recording head is mounted on a carriage, and an electrical signal is supplied to the recording element boards via the first and second wiring boards to record data on a recording medium.

* * * * *